United States Patent
Wang (10) Patent No.: US 11,476,437 B2
(45) Date of Patent: Oct. 18, 2022

(54) DISPLAY PANEL AND METHOD FOR MANUFACTURING THE SAME, DISPLAY DEVICE AND CONTROL METHOD

(71) Applicant: BOE TECHNOLOGY GROUP CO., LTD., Beijing (CN)

(72) Inventor: Dan Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 140 days.

(21) Appl. No.: 16/492,370

(22) PCT Filed: Jan. 18, 2019

(86) PCT No.: PCT/CN2019/072367
§ 371 (c)(1),
(2) Date: Sep. 9, 2019

(87) PCT Pub. No.: WO2019/242303
PCT Pub. Date: Dec. 26, 2019

(65) Prior Publication Data
US 2020/0411792 A1    Dec. 31, 2020

(30) Foreign Application Priority Data

Jun. 22, 2018    (CN) .......................... 201810649160.7

(51) Int. Cl.
| H01L 51/52 | (2006.01) |
| H01L 27/32 | (2006.01) |
| H01L 51/56 | (2006.01) |

(52) U.S. Cl.
CPC ........ *H01L 51/5237* (2013.01); *H01L 27/323* (2013.01); *H01L 27/3244* (2013.01); *H01L 51/56* (2013.01)

(58) Field of Classification Search
None
See application file for complete search history.

(56) References Cited

U.S. PATENT DOCUMENTS

| 2015/0292963 | A1* | 10/2015 | Kawamura | ............... G01L 1/16 |
| | | | | 345/174 |
| 2016/0132151 | A1* | 5/2016 | Watazu | ..................... G01L 1/16 |
| | | | | 345/174 |
| 2016/0282974 | A1  | 9/2016 | Li | |
| 2016/0285017 | A1* | 9/2016 | Liu | ......................... G01B 11/30 |
| 2017/0123558 | A1* | 5/2017 | Hong | .................... G06F 1/1652 |
| 2017/0338287 | A1* | 11/2017 | Ito | ....................... H01L 27/3225 |

(Continued)

FOREIGN PATENT DOCUMENTS

| CN | 104461010 A | 3/2015 |
| CN | 104461010 A | 3/2015 |

(Continued)

*Primary Examiner* — Michelle Mandala
*Assistant Examiner* — Jordan M Klein
(74) *Attorney, Agent, or Firm* — The Webb Law Firm (57) ABSTRACT

The present disclosure provides a display panel and a method for manufacturing the same, a display device and a control method, and relates to the field of display technique. The display panel includes a package structure on an array substrate, wherein the package structure includes a thin film encapsulation layer on the array substrate and a bending detection layer configured to detect a bending state of the display panel.

16 Claims, 4 Drawing Sheets

(56) References Cited

U.S. PATENT DOCUMENTS

| | | |
|---|---|---|
| 2018/0120615 A1 | 5/2018 | Wang et al. |
| 2019/0165327 A1 | 5/2019 | Ye |
| 2020/0033205 A1* | 1/2020 | Mori .................... H01L 41/193 |

FOREIGN PATENT DOCUMENTS

| | | |
|---|---|---|
| CN | 106406608 A | 2/2017 |
| CN | 106445267 A | 2/2017 |
| CN | 106971670 A | 7/2017 |
| CN | 106971670 A | 7/2017 |
| CN | 106990867 A | 7/2017 |
| CN | 107170374 A | 9/2017 |
| CN | 107170374 A | 9/2017 |
| CN | 107491206 A | 12/2017 |
| CN | 107728849 A | 2/2018 |
| CN | 107919380 A | 4/2018 |
| CN | 108010948 A | 5/2018 |
| CN | 108010948 A | 5/2018 |

* cited by examiner

DISPLAY PANEL AND METHOD FOR MANUFACTURING THE SAME, DISPLAY DEVICE AND CONTROL METHOD

CROSS-REFERENCE TO RELATED APPLICATIONS

The present application is a U.S. National Stage Application under 35 U.S.C. § 371 of International Patent Application No. PCT/CN2019/072367, filed on Jan. 18, 2019, which claims priority to China Patent Application No. 201810649160.7 filed on Jun. 22, 2018, the disclosures of both of which are incorporated by reference herein in their entirety.

TECHNICAL FIELD

The present disclosure relates to technical field of display, and especially to a display panel and a method for manufacturing the same, a display device and a control method.

BACKGROUND

In recent years, organic light emitting diodes (OLED) display panel has attracted more and more attention due to its active luminescence, high luminance, high resolution, wide viewing angle, fast response speed, low energy consumption and flexibility.

However, a bending state of an OLED display panel cannot be detected at present.

SUMMARY

According to one aspect of embodiments of the present disclosure, a display panel is provided. The display panel comprises a package structure on an array substrate, wherein the package structure comprises: a thin film encapsulation layer on the array substrate; and a bending detection layer configured to detect a bending state of the display panel.

In some embodiments, the thin film encapsulation layer comprises a first barrier layer on the array substrate and a second barrier layer above the first barrier layer; and the bending detection layer is located between the first barrier layer and the second barrier layer.

In some embodiments, the thin film encapsulation layer further comprises a buffer layer between the first barrier layer and the second barrier layer.

In some embodiments, the buffer layer and the bending detection layer are located in a same layer.

In some embodiments, the bending detection layer is located between the buffer layer and the second barrier layer.

In some embodiments, the bending detection layer is located on a side of the thin film encapsulation layer away from the array substrate, and the bending detection layer comprises a touch electrode.

In some embodiments, a material of the bending detection layer comprises at least one of a piezoelectric material or a piezoresistive material.

According to another aspect of embodiments of the present disclosure, a display device is provided. The display device comprises the display panel according to any one of the above embodiments.

In some embodiments, the display device further comprises: a control circuit configured to determine a current bending state of the display panel according to a change in resistance of the bending detection layer in the display panel and perform a corresponding control according to the current bending state of the display panel.

In some embodiments, the control circuit forms a loop with the bending detection layer, and the control circuit stores a correspondence between a bending state of the display panel and a value of current in the loop; the control circuit is configured to determine the current bending state of the display panel according to a current value of current in the loop and the correspondence.

According to still another aspect of embodiments of the present disclosure, a method for manufacturing a display panel is provided. The method comprises: providing an array substrate; and forming a package structure on the array substrate, wherein the package structure comprises a thin film encapsulation layer on the array substrate and a bending detection layer configured to detect a bending state of the display panel.

In some embodiments forming the package structure on the array substrate comprises: forming a first barrier layer for the thin film encapsulation layer on the array substrate; forming the bending detection layer above the first barrier layer; and forming a second barrier layer for the thin film encapsulation layer above the bending detection layer.

In some embodiments, the method further comprises: forming a buffer layer for the thin film encapsulation layer above the first barrier layer between forming the first barrier layer and forming the second barrier layer.

In some embodiments, the buffer layer and the bending detection layer are located in a same layer.

In some embodiments, the bending detection layer is located between the buffer layer and the second barrier layer.

In some embodiments, forming the package structure on the array substrate comprises: forming the thin film encapsulation layer on the array substrate; and forming the bending detection layer on a side of the thin film encapsulation layer away from the array substrate.

In some embodiments, forming the bending detection layer comprises: forming a touch electrode.

In some embodiments, a material of the bending detection layer comprises at least one of a piezoelectric material or a piezoresistive material.

According to yet still another aspect of embodiments of the present disclosure, a control method for a display device, wherein the display device comprises: a display panel, comprising a package structure on an array substrate, wherein the package structure comprises a thin film encapsulation layer on the array substrate and a bending detection layer configured to detect a bending state of the display panel; and a control circuit configured to determine a current bending state of the display panel according to a change in resistance of the bending detection layer in the display panel and perform a corresponding control according to the current bending state of the display panel; wherein the control method comprises: determining the current bending state of the display panel according to the change in resistance of the bending detection layer in the display panel; and performing the corresponding control according to the current bending state of the display panel.

In some embodiments, the control circuit in the display device forms a loop with the bending detection layer, and the control circuit stores a correspondence between a bending state of the display panel and a value of current in the loop; determining the current bending state of the display panel comprises: determining the current bending state of the display panel according to a current value of current in the loop and the correspondence.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Embodiments of the present disclosure provide a display panel comprising a package structure located on an array substrate. The package structure comprises a thin film encapsulation layer and a bending detection layer configured to detect a bending state of the display panel.

For example, the bending detection layer may be located within the thin film encapsulation layer or on a side of the thin film encapsulation layer away from the array substrate. The structure of the display panel will be described in detail below with reference to different embodiments.

Figure 1:
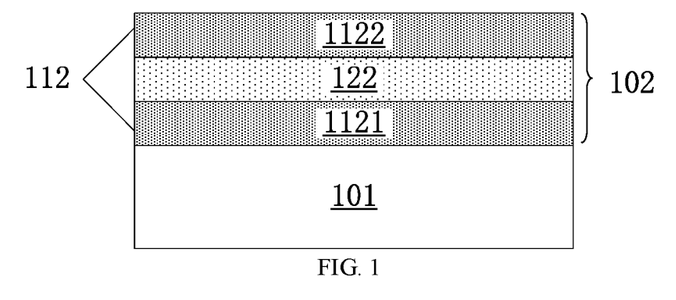
FIG. 1 is a schematic structural view showing a display panel according to an embodiment of the present disclosure.

FIG. 1 is a schematic structural view showing a display panel according to an embodiment of the present disclosure. As shown in FIG. 1, the display panel comprises a package structure 102 located on an array substrate 101. The package structure 102 comprises a thin film encapsulation layer 112 located on the array substrate 101, and a bending detection layer 122 located within the thin film encapsulation layer 112.

It should be understood that the array substrate 101 may comprise a base substrate (for example, a flexible base substrate), a thin film transistor (TFT) array located on the base substrate, and a light emitting device (for example, an OLED) located on the TFT array, or the like, which are not shown in FIG. 1.

The thin film encapsulation layer 112 may comprise a first barrier layer 1121 and a second barrier layer 1122 located above the first barrier layer 1121. The bending detection layer 122 may be located between the first barrier layer 1121 and the second barrier layer 1122. In some embodiments, a material of each of the first barrier layer 1121 and the second barrier layer 1122 may comprise an inorganic material for blocking water and oxygen, such as an oxide of silicon, a nitride of silicon, a nitric oxide of silicon, or the like. It should be understood that the thin film encapsulation layer 112 may also comprise other layers such as a buffer layer between the first barrier layer 1121 and the second barrier layer 1122. The buffer layer may reduce stress between different barrier layers. For example, a material of the buffer layer may comprise an organic material, such as Hexamethyldisiloxane (HMDSO).

The bending detection layer 122 is configured to detect the bending state of the display panel. It should be understood that the bending state of the display panel may comprise, for example, a bending angle or a folding angle of the display panel. That is, different bending states of the display panel can be understood as different bending angles or folding angles of the display panel.

In the above embodiments, the display panel comprises a bending detection layer located within the thin film encapsulation layer, and the bending detection layer is configured to detect the bending state of the display panel. For another example, since the resistance of the bending detection layer changes with the change in the bending state of the display panel, the change in the bending state of the display panel can be determined based on the change in the resistance of the bending detection layer. Also, for example, since the voltage difference between the upper and lower surfaces of the bending detection layer changes with the change in the bending state of the display panel, the change in the bending state of the display panel can be determined based on the change in the voltage difference between the upper and lower surfaces of the bending detection layer. For still another example, since the resistance of the bending detection layer and the voltage difference between the upper and lower surfaces of the bending detection layer change with the change in the bending state of the display panel, the change in the bending state of the display panel can be determined based on the change in at least one of the resistance of the bending detection layer and the voltage difference between the upper and lower surfaces of the bending detection layer.

In some embodiments, the material of the bending detection layer 122 may comprise at least one of a piezoelectric material or a piezoresistive material. It should be understood that the piezoresistive material is capable of deforming under external force, and thus a change in resistance is generated. For example, the material of the bending detection layer 122 may comprise polyvinylidene fluoride (PVDF). For another example, the material of the bending detection layer 122 may comprise a mixed material composed of graphene and polydimethylsiloxane (PDMS).

In some implementations, the material of the bending detection layer 122 comprises a piezoresistive material. In this case, the resistance of the bending detection layer 122 may change with the change in the bending state of the display panel. For example, in a case where the bending angle or the folding angle of the display panel changes, the resistance of the bending detection layer 122 changes accordingly. For example, in a case where the display panel is in a non-bending state, the bending detection layer 122 is of a first resistance. In a case where the display panel is in a first bending state, the bending detection layer 122 is of a second resistance. In a case where the display panel is in a second bending state, the bending detection layer 122 is of a third resistance. It should be understood that the first bending state is different from the second bending state, and the first resistance, the second resistance and the third resistance are different from each other. It should be also understood that the non-bending state may be considered as a special bending state with a bending angle or a folding angle of 0. In some embodiments, the greater the bending angle or folding angle is, the smaller the resistance of the bending detection layer 122 is.

In other implementations, the material of the bending detection layer 122 comprises a piezoelectric material. In this case, the voltage difference between the upper and lower surfaces of the bending detection layer 122 may change with the change in the bending state of the display panel. For example, when the bending angle or the folding angle of the display panel changes, the voltage difference between the upper and lower surfaces of the bending detection layer 122 changes accordingly.

In still other implementations, the materials of the bending detection layer 122 comprise both a piezoelectric material and a piezoresistive material. In this case, the voltage difference between the upper and lower surfaces of the bending detection layer 122 and the resistance of the bending detection layer 122 may each change with the change in the bending state of the display panel. For example, when the bending angle or the folding angle of the display panel changes, the voltage difference between the upper and lower surfaces of the bending detection layer 122 and the resistance of the bending detection layer 122 change accordingly.

It should be noted that in the following description, the same/similar components as/to those in the embodiment shown in FIG. 1 are not repeated for brevity.

Figure 2:
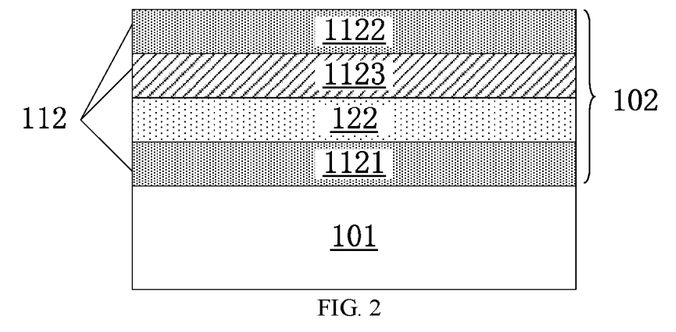
FIG. 2 is a schematic structural view showing a display panel according to another embodiment of the present disclosure.

FIG. 2 is a schematic structural view showing a display panel according to another embodiment of the present disclosure.

As shown in FIG. 2, the thin film encapsulation layer 112 comprises a first barrier layer 1121, a second barrier layer 1122 located above the first barrier layer 1121, and a buffer layer 1123 located between the first barrier layer 1121 and the second barrier layer 1122. The bending detection layer 122 is located between the first barrier layer 1121 and the buffer layer 1123.

Figure 3:
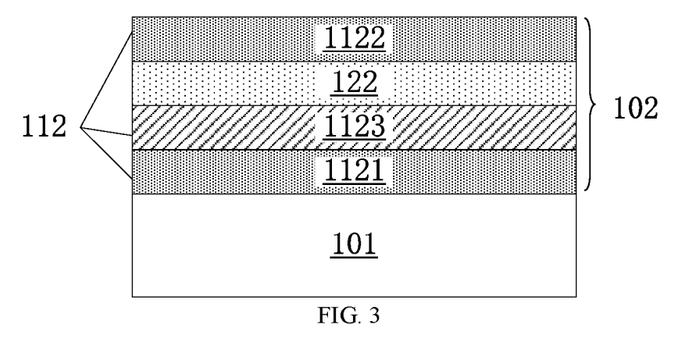
FIG. 3 is a schematic structural view showing a display panel according to still another embodiment of the present disclosure.

FIG. 3 is a schematic structural view showing a display panel according to still another embodiment of the present disclosure.

As shown in FIG. 3, the thin film encapsulation layer 112 comprises a first barrier layer 1121, a second barrier layer 1122 located above the first barrier layer 1121, and a buffer layer 1123 located between the first barrier layer 1121 and the second barrier layer 1122. The bending detection layer 122 is located between the buffer layer 1123 and the second barrier layer 1122. In such a display panel, the buffer layer 1123 may be not penetrated when the bending detection layer 122 is connected to an external circuit through leads, which is more advantageous to block water and oxygen, and a better package effect is achieved.

Compared to the display panel shown in FIG. 1, the thin film encapsulation layer 112 in the display panel shown in FIG. 2 and FIG. 3 further comprises a buffer layer 1123 between the first barrier layer 1121 and the second barrier layer 1122 other than the first barrier layer 1121 and the second barrier layer 1122. However, the present disclosure is not limited thereto.

In some embodiments, the bending detection layer 122 and the buffer layer 1123 may be located in a same layer, i.e., mixed into one layer. For example, the materials of the bending detection layer 122 may comprise a material (e.g., PVDF) with a resistance changing with the change in the bending state of the display panel, and a material (e.g., HMDSO) for the buffer layer of the thin film encapsulation layer 112.

In the above embodiments, the bending detection layer and the buffer layer are mixed into one layer. On one hand, the bending detection layer may be used to detect the bending state of the display panel. On the other hand, the bending detection layer can also act as a buffer layer. In addition, the thickness of the display panel can be reduced by mixing the bending detection layer and the buffer layer into one layer.

In the display panels shown in FIGS. 1-3 described above, the bending detection layer 122 is located within the thin film encapsulation layer 112. The case where the bending detection layer 122 is located on a side of the thin film encapsulation layer 112 away from the array substrate 101, that is, on the thin film encapsulation layer 112, will be described below with reference to FIG. 4.

Figure 4:
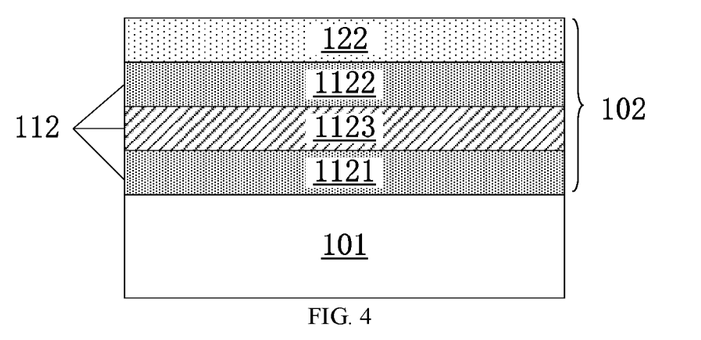
FIG. 4 is a schematic structural view showing a display panel according to yet another embodiment of the present disclosure.

FIG. 4 is a schematic structural view showing a display panel according to yet another embodiment of the present disclosure.

As shown in FIG. 4, the display panel comprises a package structure 102 located on an array substrate 101. The package structure 102 comprises a thin film encapsulation layer 112 on the array substrate 101, and a bending detection layer 122 on a side of the thin film encapsulation layer 112 away from the array substrate 101.

It should be noted that although the thin film encapsulation layer 112 shown in FIG. 4 comprises a first barrier layer 1121, a second barrier layer 1122 and a buffer layer 1123 located between the first barrier layer 1121 and the second barrier layer 1122, this is not limited. In some embodiments, some of the thin film encapsulation layer 112 shown in FIG. 4 may be omitted or some other layers may be additionally comprised by the thin film encapsulation layer 112. For example, the thin film encapsulation layer 112 may comprise only one barrier layer, for example, the first barrier layer 1121. For another example, the thin film encapsulation layer 112 may also comprise at least one laminated structure on the second barrier layer 1122. Each laminated structure may comprise a buffer layer and a barrier layer on the buffer layer.

In the above embodiments, the display panel comprises a bending detection layer located on the thin film encapsulation layer, and the bending detection layer is configured to detect the bending state of the display panel.

Figure 5:
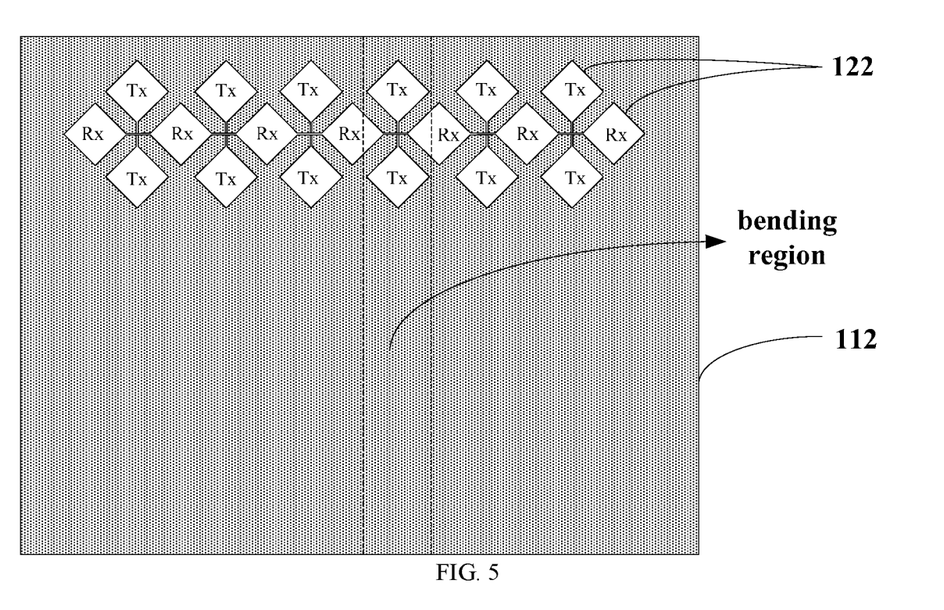
FIG. 5 is a schematic structural view showing a display panel according to yet another embodiment of the present disclosure.

FIG. 5 is a schematic structural view showing a display panel according to yet another embodiment of the present disclosure.

As shown in FIG. 5, the bending detection layer 122 on the thin film encapsulation layer 112 may comprise a touch electrode. For example, the touch electrode may comprise staggered drive electrodes Tx and sensing electrodes Rx. It should be understood that FIG. 5 only schematically illustrates the touch electrodes on part region of the thin film encapsulation layer 112, but this is not limited. For example, touch electrodes may be disposed on other regions of the thin film encapsulation layer 112.

In FIG. 5, the region shown by the dotted line frame is a bending region. The display panel can be divided into two regions located on both sides of the bending region in a case where the display panel is bent with the bending region as a boundary. After the display panel is bent, the resistance of the bending detection layer 122 changes.

In the above embodiments, the bending detection layer can be used as a touch electrode, and not only can realize the detection of the bending state of the display panel, but also can sense touch operation.

In some embodiments, the thickness of the bending detection layer in the display panel of the above embodiments ranges from a few microns to several tens of microns, such as 5 microns, 10 microns and 30 microns.

Figure 6:
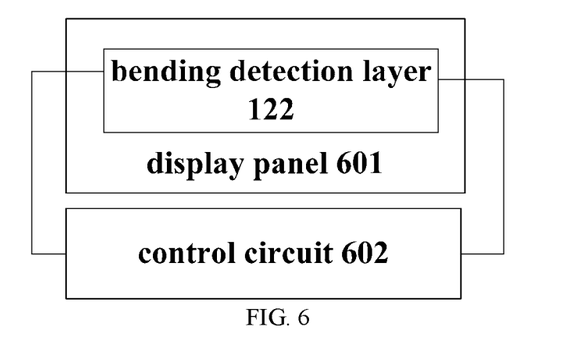
FIG. 6 is a schematic structural view showing a display device according to an embodiment of the present disclosure.

FIG. 6 is a schematic structural view showing a display device according to an embodiment of the present disclosure.

As shown in FIG. 6, the display device may comprise a display panel 601 of any of the above embodiments. In some embodiments, the display device may be any product or component having a display function such as a mobile terminal, television, display, notebook computer, digital photo frame, navigator or electronic paper.

In some embodiments, referring to FIG. 6, the display device further comprises a control circuit 602 configured to determine a current bending state of the display panel 601 according to a change in resistance of the bending detection layer 122 in the display panel 601, and perform a corresponding control according to the current bending state of the display panel 601. In other embodiments, the control circuit 602 may be configured to determine the current bending state of the display panel 601 according to a change in a voltage difference between the upper and lower surfaces of the bending detection layer 122 in the display panel 601 and perform a corresponding control according to the current bending state of the display panel 601.

In some implementations, the control circuit 602 may form a loop with the bending detection layer 122, and the change in resistance of the bending detection layer 122 may be determined based on the change in the current in the loop. When the bending state of the display panel 601 changes, the resistance of the bending detection layer 122 also changes, thus the current in the loop formed by the control circuit 602 and the bending detection layer 122 changes. For example, the control circuit 602 may store a correspondence between the bending state of the display panel 601 and the current in the loop. After the value of current in the loop changes, the control circuit 602 can determine the current bending state of the display panel 601 according to the current value of current in the loop and the correspondence, and then perform a corresponding control according to the current bending state of the display panel 601.

It should be understood that the present disclosure is not limited to the above implementation, in which the change in resistance of the bending detection layer 122 is determined. The control circuit 602 may also determine the change in resistance of the bending detection layer 122 in other ways.

In some implementations, the control circuit 602 may control the control signals input to a source driving circuit and a gate driving circuit according to the current bending state of the display panel 601, thereby controlling a display image of the display panel 601. For example, in a case where the display panel 601 is at a certain bending angle or folding angle, the control circuit 602 may control the display panel 601 to be in a dual-screen display state, i.e., a part of the display panel 601 displays one image and the other part of the display panel 601 displays another image. In a case where the display panel 601 is at another larger bending angle or folding angle, the control circuit 602 can control the display panel 601 to be in a half-screen display state, that is, a part of the display panel 601 displays an image, and the other part of the display panel 601 does not display an image.

Further, the control circuit 602 may also count the time that the display panel 601 is in the half-screen display state and compensate for the lifetime of the part of the display panel 601 that has been used for a longer time to reduce the difference between different parts of the display panel 601.

In other implementations, the control circuit 602 may also control the state of certain components according to the bending state of the display panel 601. For example, the control circuit 602 may control the angle of a camera to change correspondingly when the bending state of the display panel 601 changes to make the camera be at a predetermined position.

Those skilled in the art understand that a variety of controls may be performed by the control circuit 602 according to the bending state of the display panel 601, and no more examples will be given here.

Figure 7:
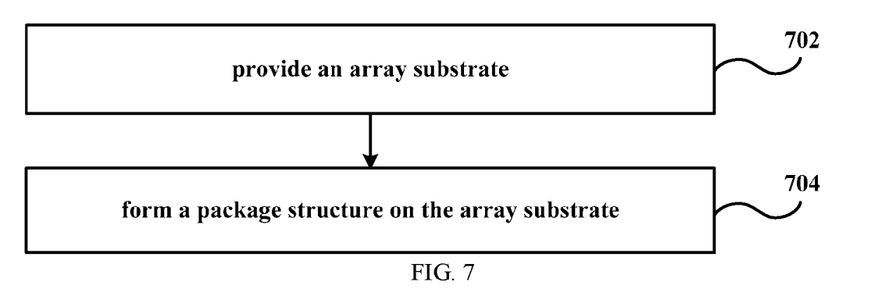
FIG. 7 is a schematic flow chart illustrating a method for manufacturing a display panel according to an embodiment of the present disclosure.

FIG. 7 is a schematic flow chart illustrating a method for manufacturing a display panel according to an embodiment of the present disclosure.

At step 702, an array substrate is provided.

For example, the array substrate may comprise a base substrate (e.g., a flexible base substrate), a TFT array located on the base substrate, and a light emitting device (e.g., an OLED) located on the TFT array, or the like.

At step 704, a package structure comprising a thin film encapsulation layer and a bending detection layer is formed on the array substrate.

The thin film encapsulation layer is located on the array substrate, and the bending detection layer is configured to detect the bending state of the display panel. For example, the bending detection layer may be located within the thin film encapsulation layer or on a side of the thin film encapsulation layer away from the array substrate.

The display panel formed in the above embodiments comprises a bending detection layer. The bending detection layer is configured to detect the bending state of the display panel.

Figure 8:
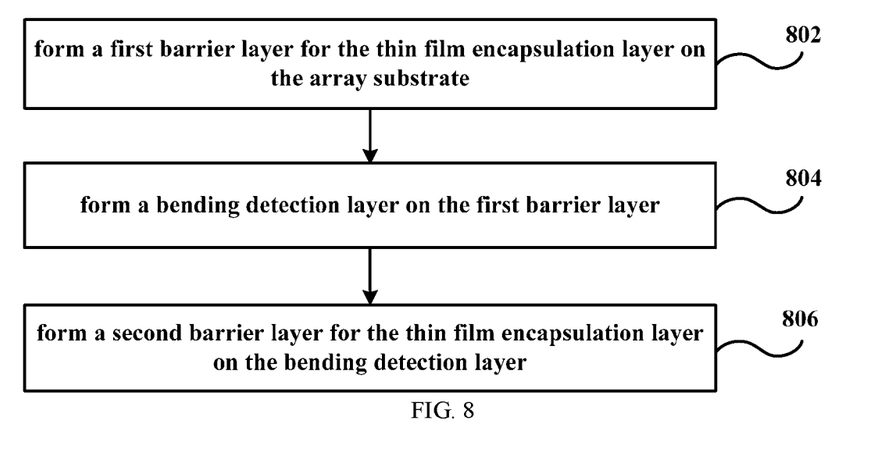
FIG. 8 is a schematic flow chart illustrating a method for forming a package structure according to an implementation of the present disclosure.

FIG. 8 is a schematic flow chart illustrating a method for forming a package structure according to an implementation of the present disclosure.

At step 802, a first barrier layer for the thin film encapsulation layer is formed on an array substrate. For example, the first barrier layer may be formed through a process such as chemical vapor deposition (CVD).

At step 804, a bending detection layer is formed on the first barrier layer. In some embodiments, the material of the bending detection layer comprises at least one of a piezoelectric material or a piezoresistive material.

In some implementations, the material for the bending detection layer and the material for the buffer layer of the thin film encapsulation layer may be mixed to obtain a mixed material, and the mixed material is then printed on the first barrier layer.

At step 806, a second barrier layer for the thin film encapsulation layer is formed on the bending detection layer. For example, the second barrier layer may be formed through a process such as CVD.

In some embodiments, a buffer layer for the thin film encapsulation layer may also be formed on the first barrier layer between step 802 and step 806.

In some implementations, the buffer layer and the bending detection layer may be located in a same layer, i.e., mixed into one layer. For example, the material for the bending detection layer and the material for the buffer layer of the thin film encapsulation layer may be mixed to obtain a mixed material, and the mixed material is then printed on the first barrier layer.

In other implementations, the buffer layer and the bending detection layer may be located in different layers, for example, the bending detection layer may be located between the buffer layer and the second barrier layer.

In the package structure formed in the above embodiments, the bending detection layer is located in the thin film encapsulation layer. The bending detection layer is configured to detect the bending state of the display panel.

Figure 9:
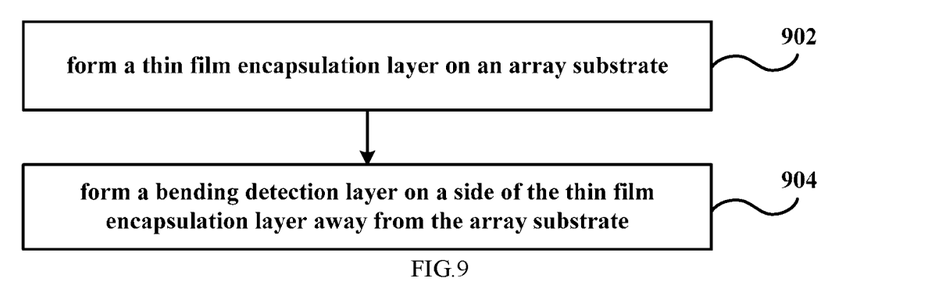
FIG. 9 is a schematic flow chart illustrating a method for forming a package structure according to another implementation of the present disclosure.

FIG. 9 is a schematic flow chart illustrating a method for forming a package structure according to another implementation of the present disclosure.

At step 902, a thin film encapsulation layer is formed on an array substrate.

For example, the thin film encapsulation layer may comprise only one barrier layer. For another example, the thin film encapsulation layer may comprise two barrier layers and a buffer layer disposed between the two barrier layers. For still another example, the thin film encapsulation layer may comprise two barrier layers, a buffer layer between the two barrier layers, and at least one laminated structure on the buffer layer. Each laminated structure may comprise one buffer layer and one barrier layer on the buffer layer.

At step 904, a bending detection layer is formed on a side of the thin film encapsulation layer away from the array substrate. For example, the bending detection layer may be formed through plasma enhanced chemical vapor deposition (PECVD), evaporation, or sputtering processes, or the like.

In some embodiments, a touch electrode may be formed when the bending detection layer is formed. For example, the bending detection layer may be formed as staggered drive electrodes and sensing electrodes. The bending detection layer can be used as a touch electrode, and not only can realize the detection of the bending state of the display panel, but also can sense touch operation.

In the package structure formed by the above implementations, the bending detection layer is located on the side of the thin film encapsulation layer away from the array substrate. The buffer layer may be not penetrated when the bending detection layer 122 is connected to an external circuit through leads. On one hand, the bending state of the display panel can be detected. On the other hand, the package effect is not affected.

Figure 10:
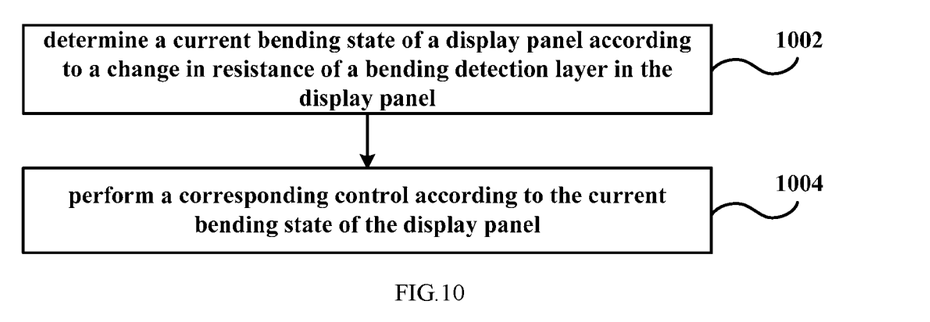
FIG. 10 is a schematic flow chart illustrating a control method according to an embodiment of the present disclosure.

FIG. 10 is a schematic flow chart illustrating a control method according to an embodiment of the present disclosure. The control method can be implemented based on the display device of above embodiments.

At step 1002, a current bending state of the display panel is determined according to a change in resistance of the bending detection layer in the display panel.

In some embodiments, the control circuit may form a loop with the bending detection layer, and the change in resistance of the bending detection layer may be determined according to the change in the value of current in the loop. For example, a correspondence between a bending state of the display panel and a value of current in the loop may be stored in the control circuit. After the value of current in the loop changes, the control circuit may determine the current bending state of the display panel according to the current value of current in the loop and the correspondence.

At step 1004, a corresponding control is performed according to the current bending state of the display panel.

The controls according to the current bending state of the display panel by the control circuit have been described in detail above and will not be described here.

In the above embodiments, the current bending state of the display panel can be determined according to the change in the resistance of the bending detection layer, and a corresponding control can be performed according to the current bending state of the display panel.

In other embodiments, the current bending state of the display panel may also be determined according to the change in the voltage difference between the upper and lower surfaces of the bending detection layer, and a corresponding control may be performed according to the current bending state of the display panel.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
an array substrate, comprising a base substrate, a thin film transistor array located on the base substrate, and a light emitting device located on the thin film transistor array; and
a package structure on the array substrate, wherein the package structure comprises:
a thin film encapsulation layer for blocking water and oxygen on the array substrate, wherein the thin film encapsulation layer comprises a first barrier layer on the array substrate, and a second barrier layer above the first barrier layer, wherein a material of each of the first barrier layer and the second barrier layer comprises an inorganic material; and
a bending detection layer configured to detect a bending state of the display panel, wherein the bending detection layer is located between the first barrier layer and the second barrier layer, wherein a material with a resistance changing with the change in the bending state of the display panel in the bending detection layer and an organic material for a buffer layer of the thin film encapsulation layer in the bending detection layer is mixed into one layer.

2. The display panel according to claim 1, wherein a material of the bending detection layer comprises at least one of a piezoelectric material or a piezoresistive material.

3. The display panel according to claim 2, wherein the material of the bending detection layer comprises polyvinylide fluoride (PVDF), or comprises a mixed material composed of graphene and polydimethylsiloxane (PDMS).

4. A display device, comprising the display panel according to claim 1.

5. The display device according to claim 4, further comprising:
a control circuit configured to determine a current bending state of the display panel according to a change in resistance of the bending detection layer in the display panel and perform a corresponding control according to the current bending state of the display panel.

6. The display device according to claim 5, wherein the control circuit forms a loop with the bending detection layer, and the control circuit stores a correspondence between a bending state of the display panel and a value of current in the loop;
the control circuit is configured to determine the current bending state of the display panel according to a current value of current in the loop and the correspondence.

7. A control method for the display device according to claim 5, comprising:
determining the current bending state of the display panel according to the change in resistance of the bending detection layer in the display panel; and
performing the corresponding control according to the current bending state of the display panel.

8. The control method according to claim 7, wherein the control circuit in the display device forms a loop with the bending detection layer, and the control circuit stores a correspondence between a bending state of the display panel and a value of current in the loop;
determining the current bending state of the display panel comprises:
determining the current bending state of the display panel according to a current value of current in the loop and the correspondence.

9. The display panel according to claim 1, wherein the organic material comprises Hexamethyldisiloxane (HMDSO).

10. A display panel, comprising:
an array substrate, comprising a base substrate, a thin film transistor array located on the base substrate, and a light emitting device located on the thin film transistor array; and
a package structure on the array substrate, the package structure comprising:
a thin film encapsulation layer for blocking water and oxygen on the array substrate; and
a bending detection layer configured to detect a bending state of the display panel, wherein the bending detection layer is located on a side of the thin film encapsulation layer away from the array substrate, the bending detection layer comprises a touch electrode formed in a single layer, and a material of the bending detection layer comprises at least one of a piezoelectric material or a piezoresistive material.

11. A display device, comprising the display panel according to claim 10.

12. The display device according to claim 11, further comprising:
a control circuit configured to determine a current bending state of the display panel according to a change in resistance of the bending detection layer in the display panel and perform a corresponding control according to the current bending state of the display panel.

13. The display device according to claim 12, wherein the control circuit forms a loop with the bending detection layer, and the control circuit stores a correspondence between a bending state of the display panel and a value of current in the loop;
the control circuit is configured to determine the current bending state of the display panel according to a current value of current in the loop and the correspondence.

14. A control method for the display device according to claim 12, comprising:
determining the current bending state of the display panel according to the change in resistance of the bending detection layer in the display panel; and
performing the corresponding control according to the current bending state of the display panel.

15. A method for manufacturing a display panel, comprising:
providing an array substrate, the array substrate comprising a base substrate, a thin film transistor array located on the base substrate, and a light emitting device located on the thin film transistor array; and
forming a package structure on the array substrate, wherein the package structure comprises a thin film encapsulation layer for blocking water and oxygen on the array substrate and a bending detection layer configured to detect a bending state of the display panel, wherein forming the package structure on the array substrate comprises:

forming a first barrier layer for the thin film encapsulation layer on the array substrate;

forming the bending detection layer above the first barrier layer, wherein a material with a resistance changing with the change in the bending state of the display panel in the bending detection layer and an organic material for a buffer layer of the thin film encapsulation layer in the bending detection layer is mixed into one layer; and forming a second barrier layer for the thin film encapsulation layer above the bending detection layer, wherein a material of each of the first barrier layer and the second barrier layer comprises an inorganic material.

16. The method according to claim 15, wherein a material of the bending detection layer comprises at least one of a piezoelectric material or a piezoresistive material.

* * * * *

UNITED STATES PATENT AND TRADEMARK OFFICE
CERTIFICATE OF CORRECTION

| | |
|---|---|
| PATENT NO. | : 11,476,437 B2 |
| APPLICATION NO. | : 16/492370 |
| DATED | : October 18, 2022 |
| INVENTOR(S) | : Dan Wang |

It is certified that error appears in the above-identified patent and that said Letters Patent is hereby corrected as shown below:

In the Claims

Column 11, Lines 43-44, Claim 3, delete "polyvinylide fluoride" and insert -- polyvinylidene fluoride --

Signed and Sealed this
Twentieth Day of December, 2022

Katherine Kelly Vidal
*Director of the United States Patent and Trademark Office*